(12) United States Patent
Nicol

(10) Patent No.: US 10,203,935 B2
(45) Date of Patent: *Feb. 12, 2019

(54) POWER CONTROL WITHIN A DATAFLOW PROCESSOR

(71) Applicant: Wave Computing, Inc., Campbell, CA (US)

(72) Inventor: Christopher John Nicol, Campbell, CA (US)

(73) Assignee: Wave Computing, Inc., Campbell, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/667,338

(22) Filed: Aug. 2, 2017

(65) Prior Publication Data
US 2017/0357483 A1 Dec. 14, 2017

Related U.S. Application Data

(63) Continuation-in-part of application No. 15/443,612, filed on Feb. 27, 2017, which is a continuation-in-part (Continued)

(51) Int. Cl.
H03K 19/177 (2006.01)
H01L 25/00 (2006.01)
(Continued)

(52) U.S. Cl.
CPC .......... *G06F 5/085* (2013.01); *G06F 1/3287* (2013.01); *G06F 1/3296* (2013.01);
(Continued)

(58) Field of Classification Search
None
See application file for complete search history.

(56) References Cited

U.S. PATENT DOCUMENTS 6,134,605 A 10/2000 Hudson et al.
6,363,470 B1 3/2002 Laurenti et al.
(Continued)

FOREIGN PATENT DOCUMENTS

JP 2005165961 A 12/2003
WO WO2009131569 A1 10/2009

OTHER PUBLICATIONS

International Search Report dated Feb. 6, 2015 for PCT/US2014/063591.
(Continued)

*Primary Examiner* — Anh Q Tran
(74) *Attorney, Agent, or Firm* — Adams Intellex, PLC

(57) ABSTRACT

Techniques are disclosed for power conservation. A plurality of processing elements and a plurality of instructions are configured. The plurality of processing elements is controlled by instructions contained in a plurality of circular buffers. The plurality of processing elements can comprise a dataflow processor. A first processing element, from the plurality of interconnected processing elements, is set into a sleep state by a first instruction from the plurality of instructions. The first processing element is woken from the sleep state as a result of valid data being presented to the first processing element. A subsection of the plurality of interconnected processing elements is also set into a sleep state based on the first processing element being set into a sleep state. At least one circular buffer from the plurality of circular buffers remains awake while the first processing element is in the sleep state, and the at least one circular buffer provides for data steering through a reconfigurable fabric.

25 Claims, 8 Drawing Sheets

Related U.S. Application Data of application No. 14/530,624, filed on Oct. 31, 2014, now Pat. No. 9,590,629.

(60) Provisional application No. 62/399,760, filed on Sep. 26, 2016, provisional application No. 61/899,180, filed on Nov. 2, 2013.

(51) Int. Cl.
 G06F 7/38 (2006.01)
 G06F 5/08 (2006.01)
 G06F 9/4401 (2018.01)
 H03K 19/0175 (2006.01)

(52) U.S. Cl.
 CPC ... *G06F 9/4418* (2013.01); *H03K 19/017581* (2013.01); *H03K 19/1776* (2013.01); *H03K 19/17764* (2013.01)

(56) References Cited

U.S. PATENT DOCUMENTS

| | | | |
|---|---|---|---|
| 7,420,390 B1 | 9/2008 | Hutton et al. | |
| 8,078,839 B2 | 12/2011 | Fant | |
| 8,314,636 B2 | 11/2012 | Hutton et al. | |
| 8,341,469 B2 | 12/2012 | Miyama et al. | |
| 8,738,860 B1 * | 5/2014 | Griffin | G06F 12/0897 711/122 |
| 2007/0133399 A1 | 6/2007 | Gangwal | |
| 2009/0089605 A1 | 4/2009 | Westwick et al. | |
| 2010/0013517 A1 | 1/2010 | Manohar et al. | |
| 2010/0281448 A1 | 11/2010 | He | |
| 2011/0199117 A1 | 8/2011 | Hutchings et al. | |
| 2012/0119781 A1 | 5/2012 | Manohar et al. | |
| 2012/0235839 A1 | 9/2012 | Mazumdar et al. | |
| 2012/0319730 A1 | 12/2012 | Fitton et al. | |
| 2013/0009666 A1 | 1/2013 | Hutton et al. | |
| 2013/0009667 A1 | 1/2013 | Calhoun et al. | |
| 2013/0043902 A1 | 2/2013 | Rahim et al. | |
| 2014/0075144 A1 | 3/2014 | Sanders et al. | |
| 2014/0189401 A1 * | 7/2014 | Keppel | G06F 1/3206 713/323 |

OTHER PUBLICATIONS

Stratix II Device Handbook, vol. 1, published by Altera Corporation © May 2007.

* cited by examiner

POWER CONTROL WITHIN A DATAFLOW PROCESSOR

RELATED APPLICATIONS

This application claims the benefit of U.S. provisional patent application "Power Control within a Dataflow Processor" Ser. No. 62/399,760, filed Sep. 26, 2016. This application is also a continuation in part of U.S. patent application "Logical Elements with Switchable Connections for Multifunction Operation" Ser. No. 15/443,612, filed Feb. 27, 2017.

The patent application "Logical Elements with Switchable Connections for Multifunction Operation" Ser. No. 15/443,612, filed Feb. 27, 2017, is a continuation-in-part of U.S. patent application "Logical Elements with Switchable Connections" Ser. No. 14/530,624, filed Oct. 31, 2014, which claims the benefit of U.S. provisional patent application "Logical Elements with Switchable Connections" Ser. No. 61/899,180, filed Nov. 2, 2013. Each of the foregoing applications is hereby incorporated by reference in its entirety.

FIELD OF ART

This application relates generally to power conservation and more particularly to power control within a dataflow processor.

BACKGROUND

Semiconductor integrated circuits or "chips" are designed to perform a wide variety of functions in electronic systems, as well as enable those systems to perform their functions both effectively and efficiently. In fact, it is no secret that these chips are ubiquitous in the modern electronic systems and devices with which people interact on a daily basis. The chips are based on highly complex device technologies, circuit designs, system architectures and implementations, and are integral to the electronic systems. These chips implement system functions such as communications, processing, and networking, and perform critical functions including computation, storage, and control. The chips are found in the electronic systems that are have applications in fields such as business, entertainment, and consumer electronics. These electronic systems routinely contain more than one chip. The chips support the electronic systems by computing algorithms and heuristics, handling and processing data, communicating internally and externally to the electronic system, and so on. Since there are so many functions and computations that must be performed, any improvements in the efficiency of the chip operations have a significant and substantial impact on overall system performance. As the amount of data to be handled by the chips increases, the approaches that are used must not only be effective, efficient, and economical, but must also scale reasonably.

Semiconductor devices are vastly complex structures. Various semiconductors, including application specific integrated circuits (ASICs), are designed with a certain purpose in mind. One downside of the specific design parameters of an ASIC is the circuit can no longer be altered after it leaves the production line. For this reason, ASIC designers need to be sure of their design, especially when producing large quantities of the same ASIC. In contrast, a programmable logic device such as a field programmable gate array (FPGA) is also a type of semiconductor, but does not have specific programming built into the design during production. Programmable logic devices often can be reprogrammed while remaining in their environment of use (e.g. while mounted on the circuit board within which the device is intended to function). Programmable logic devices typically include logic blocks (e.g. programmable Boolean logic gates) and can also include programmable memory blocks, programmable clocking blocks, and other specialized programmable blocks such as multiplier blocks and I/O ports.

Typically, programmable logic devices are programmed using a programming language to implement specific, desired logic in the programmable logic devices. The programmable logic devices can be programmed by writing data to storage on the programmable logic devices. A programmable logic device architecture includes a programmable routing structure and an array of configurable logic blocks. The programmable routing matrix includes an ability to connect configurable logic blocks to each other.

Programmable logic devices allow adaptability to meet future (unforeseen) changes in functional requirements. In some cases, programmable logic devices are used as prototypes for ASIC or other devices. Using a programmable logic device to prototype an ASIC for verification and initial software development is a useful way to both decrease development time and reduce the risk of first silicon failure for the ASIC. Programmable logic devices function well in many applications such as digital video, graphics processing, communications, encryption, medical equipment, mobile computing, and instrumentation—areas all of which are continuing to play an important role in the implementation of many new programmable logic designs.

SUMMARY

Logical elements-including processing elements, storage elements, and switching elements-are arranged into clusters. Clusters are arranged in groups interconnected by a structure referred to as a switching fabric. The structure can comprise a dataflow processor. The switching fabric includes logical elements, such as switching elements. Each cluster contains circular buffers which contain configuration instructions for the cluster. The instructions within a circular buffer allow the switching elements to be controlled. The instructions within the buffer reconfigure the logical elements, thus allowing for a dynamic programmable logic device.

A processor-implemented method for power conservation is disclosed comprising: configuring a plurality of interconnected processing elements and a plurality of instructions, wherein the plurality of instructions is contained within a plurality of circular buffers; setting a first processing element, from the plurality of interconnected processing elements, into a sleep state by a first instruction from the plurality of instructions; and waking the first processing element from the sleep state as a result of valid data being presented to the first processing element. The placing of one or more processing elements and/or circular buffers into a sleep state, and the waking of the one or more processing elements and/or circular buffers, can accomplish power conservation during the sleep states of the processing elements and circular buffers. The transition to a sleep state can be slow and can include powering down portions of the plurality of interconnected processing elements. A slow transition back to a waking state can include powering up the portions of the interconnected processing elements. A rapid transition to a sleep state can be accomplished by limiting clocking to portions of the plurality of interconnected processing elements. A rapid transition back to a waking state can include removing clocking limitations on portions of the interconnected processing elements.

Reconfigurable arrays or clusters of processing elements, switching elements, etc., have many applications where the high-speed transfer and processing of data is advantageous. The clusters can comprise a dataflow processor. Interfaces to the clusters can support multiple master/slave interfaces, where a master processing element can control data transfer, and a slave processing element can be a reader (sink of data), a writer (source of data), etc. The interfaces are coupled to first in first out (FIFO) blocks that provide the interfaces with custom logic and alignment between the FIFO channels and a static schedule of a row or a column of the clusters. The slave interfaces can load programs into the clusters. Each interface can be connected to various configuration paths, where each path is buffered to support independent and concurrent operations.

Embodiments include a computer program product embodied in a non-transitory computer readable medium for power conservation, the computer program product comprising code which causes one or more processors to perform operations of: configuring a plurality of interconnected processing elements and a plurality of instructions, wherein the plurality of instructions is contained within a plurality of circular buffers; setting a first processing element, from the plurality of interconnected processing elements, into a sleep state by a first instruction from the plurality of instructions; and waking the first processing element from the sleep state as a result of valid data being presented to the first processing element.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
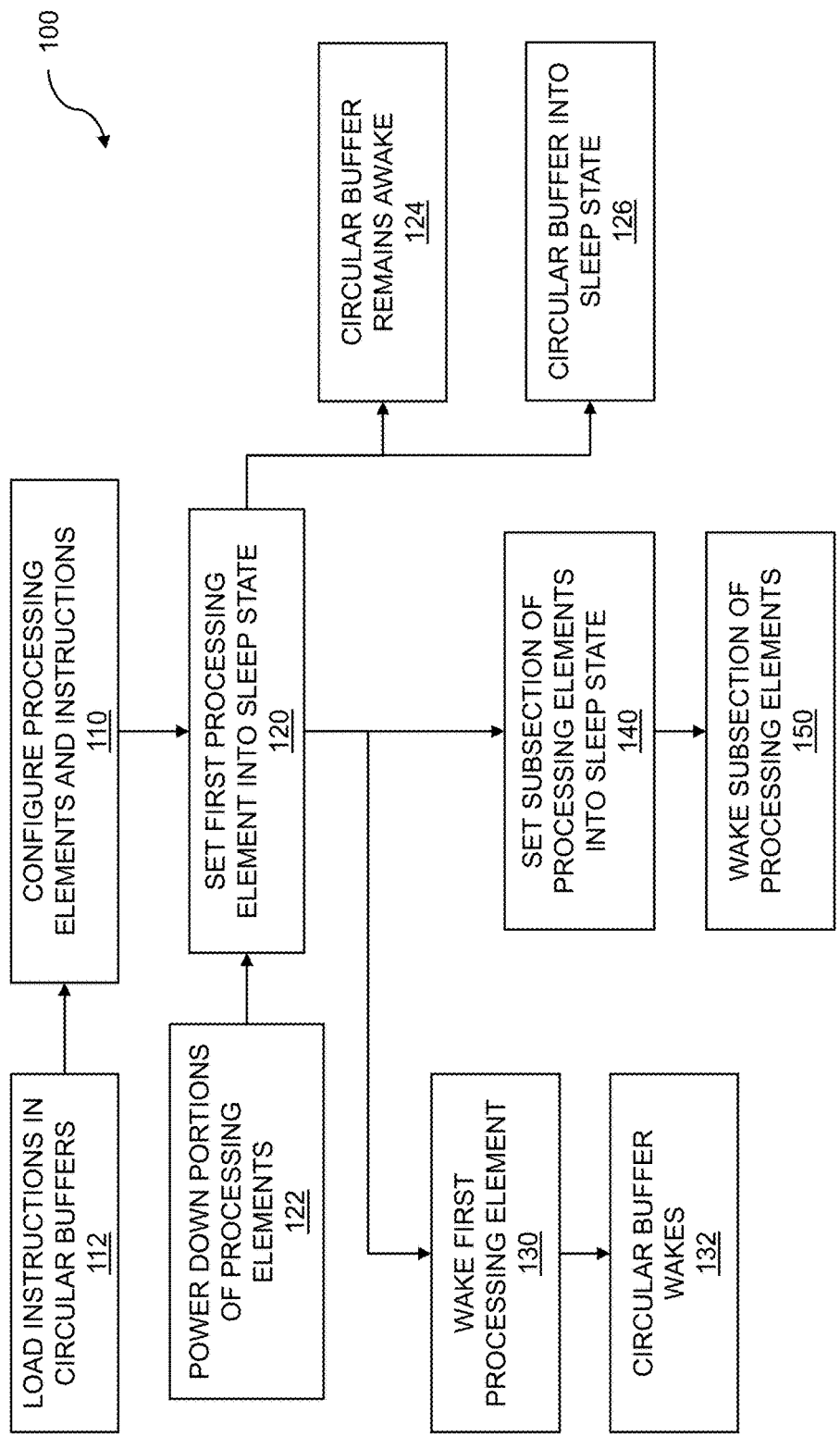
FIG. 1 is a flow diagram for power conservation.

Techniques are disclosed for power conservation. The electronics and semiconductor industries are both highly market driven. These industries are compelled by commercial, military, and other market segments to improve the semiconductor chips and systems that they design, develop, implement, fabricate, and deploy. Price and performance are the two most critical elements of semiconductor chips. Improvements of the semiconductor chips are measured based on factors such as design criteria that include the price, dimensions, speed, power consumption, heat dissipation, feature sets, compatibility, etc. These chip measurements find their ways into designs of the semiconductor chips and the capabilities of the electronic systems that are built from the chips. The semiconductor chips and systems are deployed in nearly all market segments including commercial, medical, consumer, educational, financial, etc. The applications include among many others computation, digital communications, control and automation, etc. The abilities of the chips to perform basic logical operations and to process data, at high speed, are fundamental to any of the chip and system applications. The abilities of the chips to transfer very large data sets have become particularly critical because of the increased demands of many applications including artificial intelligence, data mining, and so on.

Chip, system, and computer architectures have traditionally relied on controlling the flow of data through the chip, system, or computer. In these architectures, such as the classic von Neumann architecture where memory is shared for storing instructions and data, a set of instructions is executed to process data. In this type of architecture, referred to as a "control flow", the execution of the instructions can be predicted and can be deterministic. That is, the way in which data is processed depends on the point in a set of instructions at which a chip, system, or computer is operating. In contrast, a "dataflow" architecture is one in which the data controls the order of operation of the chip, system, or computer. The dataflow control can be determined by the presence or absence of data. Dataflow architectures find applications in many areas including the fields of networking and digital signal processing, as well as other areas in which large data sets must be handled such as telemetry and graphics processing. Dataflow processors are extremely useful in performing deep learning and machine learning functions more efficiently than other, traditional processors.

Semiconductor chips and systems and systems can be placed into sleep states in order to conserve power. The sleep states can be based on powering down portions or all of a chip or system, limiting clock rates, turning off control signals, suspending data transfers, etc. A plurality of interconnected processing elements and a plurality of instructions can be had. A first processing element, from the plurality of interconnected processing elements, can be set into a sleep state by a first instruction from the plurality of instructions. The first processing element can be woken from the sleep state as a result of valid data being presented to the first processing element. The putting of one or more processing elements and/or circular buffers into a sleep state, and the waking of the one or more processing elements and/or circular buffers, can accomplish power conservation during the sleep states of the processing elements and circular buffers.

Programmable logic devices such as FPGAs have wide applicability due to FPGAs' flexibility and ability to be reprogrammed within their operating environment. While an FPGA can be reprogrammed, a given program only allows the FPGA to remain in a certain logical arrangement to accomplish a specific logical task or function. The specific logical function is loaded into the FPGA at load time, and then the FPGA runs that function during run time. As an example, if the FPGA is loaded with code to implement a certain function within a certain portion of the FPGA, the function of that portion does not change until the FPGA is reprogrammed. Therefore while within the FPGA, many elemental logic functions can be programmed during load time, the FPGA itself is performing only one function per load. For example, an FPGA can be programmed to have an overall function of a DDR DRAM memory controller. While different portions of the FPGA perform different elemental logic functions, such as address generation or dataflow control, the FPGA can only function as a DDR memory controller until a new program is loaded, which takes a relatively long time. The address generation logic doesn't become dataflow control during run time, but only if the FPGA were to be programmed during load time to become a new function. FPGA load time is often measured in seconds or minutes, and is certainly not run time, which is often measured in nanoseconds or picoseconds. In contrast, embodiments disclosed herein provide an improved programmable logic device capable of executing a series of logic operations by dynamic reconfiguration using instructions stored in a circular buffer. For example, one program can be stored in the circular buffer that is attached to logical elements. As the circular buffer rotates, different instructions from the stored program are executed, allowing the logical elements and interconnections to perform two or more functions or operations based on the instructions in the circular buffer without changing programs.

Embodiments disclosed herein configure clusters of logical elements. The logical elements can include processing elements, storage elements, and switching elements. The processing elements can also include processor cores capable of executing machine instructions. The storage elements can include registers, caches, and/or on chip memories. The switching elements can include bus control circuits, which can be configured to route data on a bus from one cluster to another cluster. The logical elements are controlled using circular buffers.

FIG. 1 is a flow diagram for power conservation. A plurality of interconnected processing elements and a plurality of instructions can be configured, wherein the plurality of instructions is contained within a plurality of circular buffers. A first processing element, from the plurality of interconnected processing elements, can be set into a sleep state by a first instruction from the plurality of instructions. The first processing element can be woken from the sleep state as a result of valid data being presented to the first processing element. The putting of one or more processing elements and/or circular buffers into a sleep state, and the waking of the one or more processing elements and/or circular buffers, can accomplish power conservation during the sleep states of the processing elements and circular buffers.

The flow 100 includes configuring a plurality of interconnected processing elements and a plurality of instructions 110. The processing elements can include switching elements, controlling elements, interface elements, storage elements, and so on. The plurality of interconnected processing elements can form a reconfigurable fabric. The interconnected processing elements of the reconfigurable fabric can be programmed by the plurality of instructions. The plurality of instructions can be loaded into and contained within a plurality of circular buffers 112. A circular buffer from the plurality of circular buffers can be formed from a memory and an address pointer sequencing through an address space in a circular fashion. The memory can be a RAM, a ROM, a non-volatile memory, an optical memory, and so on. The memory can include a series of locations from a DRAM. Since the circular buffer is endless, the same sequence of instructions can be repeated. The order of execution of the instructions in the circular buffer can be changed by starting the sequence of instructions at a different starting point within the sequence of instructions. The operations of the circular buffers can be scheduled, programmed, and controlled. In embodiments, the plurality of circular buffers can be statically scheduled. The static scheduling of the circular buffers can occur at power-up, at reset, as a result of valid data being available, etc. The plurality of circular buffers can be programmed and instructions within the plurality of circular buffers can provide for dynamic programming. The programming of the circular buffers can be dynamic, since the contents of the circular buffers can be written, changed, overwritten, etc. The plurality of circular buffers can dynamically change operation of the plurality of interconnected processing elements. The dynamic change of operation of the interconnected processing elements can be due to advancing by one or more steps through the contents (e.g. instructions) in the circular buffers, by reloading the circular buffers, and so on. In embodiments, the instructions within the plurality of circular buffers can include the plurality of instructions. The instructions within the plurality of circular buffers can be the same across some or all of the circular buffers. Multiple sets of instructions can be stored in one or more circular buffers.

The flow 100 includes setting a first processing element, from the plurality of interconnected processing elements, into a sleep state 120 by a first instruction from the plurality of instructions. The first instruction can be a sleep instruction. Execution of the sleep instruction can set the first processing element into the sleep state, where the sleep state of the first processing element can include a powered down state, a low power state, a suspended state, an idle state, and so on. In embodiments, the first processing element can place itself into the sleep state. The first processing element can place itself into a sleep state based on an instruction in a circular buffer, on the absence of valid data, on a status flag, and so on. At least one circular buffer from the plurality of circular buffers can remain awake 124 while the first processing element is in the sleep state. In embodiments, a circular buffer associated with the first processing element can continue to cycle while the first processing element is in the sleep state, but instructions from the circular buffer are not executed. One or more circular buffers can be placed into a sleep state. In embodiments, a circular buffer, from the plurality of circular buffers, associated with the first processing element can be placed into the sleep state 126 along with the first processing element. As for the processing element, the sleep state for the circular buffer can be a powered down state, a low power state, etc.

The transition of a processing element to a sleep state can be a rapid transition or a slow transition. In embodiments, the sleep state can include a rapid transition to sleep state capability. A rapid transition to a sleep state can be an immediate transition that may or may not store data, current state information, current status information, and so on. Several techniques can be applied to cause a processing element or a circular buffer to enter into a sleep state. In embodiments, the rapid transition to sleep state capability can be accomplished by limiting clocking to portions of the plurality of interconnected processing elements. Limiting clocking to portions of the interconnected processing elements can slow down the processing elements, can reduce power consumption of the processing elements, and so on. In embodiments, the sleep state comprises a slow transition to sleep state capability. The slow transition to a sleep state can be accomplished by saving data, current state information, and so on, prior to placing the processing element into the sleep state. The slow transition to sleep state capability can be accomplished by powering down portions of the plurality of interconnected processing elements 122. Other portions of the plurality of interconnected processing elements can be or remain powered up. In embodiments, a quad of processors associated with the first processing element can be placed into a sleep state based on the first processing element being set into a sleep state. The transition of the quad of processors into the sleep state can be a rapid transition or a slow transition.

The flow 100 includes waking the first processing element 130 from the sleep state as a result of valid data being presented to the first processing element. The waking the first processing element from the sleep state can be based on non-empty data being presented to the first processing element. The validity of the data can be based on the presence of data, a valid signal, control signals, etc. The valid data can be provided from a variety of sources including by reading the data from a DRAM, uploading the data by a user, downloading the data from the Internet, etc. In embodiments, the valid data can be provided by a second processing element from the plurality of interconnected processing elements. The second processing element can be in a waking state while the first processor remains in a sleep state. The providing of data by a circular buffer can be accomplished by data steering. In embodiments, the at least one circular buffer can provide for data steering through a reconfigurable fabric. The data steering can be accomplished by programming of switching elements. The reconfigurable fabric can include the plurality of interconnected processing elements. The reconfigurable fabric can include other elements including switching elements, controlling elements, interface elements, etc.

In addition to the waking of the first processing element 130, the circular buffer can wake 132 along with the first processing element. Note that a circular buffer contains instructions, where the instructions can be addressed by a program counter. In some embodiments, the circular buffer can wake at a same address as when the circular buffer was placed in the sleep state. When the buffer awakes at the same address, the same instruction can be pointed to, and execution of the instructions can continue on from the point at which the circular buffer was placed into a sleep state. In other embodiments, the circular buffer can wake at an address that has continued to increment while the circular buffer was in the sleep state. The continued incrementing does not cause instructions to be executed because the circular buffer can be in a sleep state. When the circular does wake from the sleep state, execution of the instructions in the circular buffer can continue from the address to which the circular buffer currently is pointed. The waking of a processing element and/or a circular buffer can be accomplished with a rapid transition to being awake. The rapid transition to being awake can be accomplished by removing the limitations placed on clocking at the time the processing element and/or circular buffer was placed into a sleep state via a rapid transition. The awaking of a processing element and/or circular buffer can be accomplished with a slow transition to being awake. The slow transition of a processing element and/or a circular buffer to be awake can be accomplished by powering up portions of the plurality of interconnected processing elements that were previously powered down.

Whether data is valid or not can be determined using a variety of techniques. As described above, the data can be valid based presence of data and invalid based on the absence of data. The data can be determined using various logic techniques. In embodiments, the valid data can be defined as being valid based on a null convention logic protocol. Here, "valid" can mean that the null convention logic gate outputs have settled and are ready for reading. Other logic families and protocols can be used to determining the validity of data. Control signals can be used to determine whether data is valid or not. The valid data can be defined as being valid based on a valid signal line. The valid data can be defined as being valid based on a combination of data lines, signal lines, control lines, etc.

The flow 100 includes setting a subsection of the plurality of interconnected processing elements also into a sleep state 140 based on the first processing element being set into a sleep state. Other interconnected processing elements can experience a rapid transition to a sleep state, a slow transition to a sleep state, or both. In embodiments, all processing elements from the plurality of processing elements can be placed into a sleep state based on the first processing element being set into a sleep state. The flow 100 includes waking the subsection 150 of the plurality of interconnected processing elements. The waking the subsection of the plurality of interconnected processing elements can include waking all of the interconnected processing elements. The waking of the subsection of processing elements can be a slow transition and a rapid transition. In embodiments, a third processing element can remain asleep due to non-valid data being provided to the third processing element. In embodiments, the plurality of interconnected processing elements can comprise a dataflow processor. Dataflow processors can provide critical performance improvements over traditional, von Neumann type processors for certain applications involving large amounts of data. For example, a dataflow processor can efficiently accomplish deep learning, big data processing, and machine learning. In embodiments, the plurality of circular buffers is statically scheduled. In embodiments, the plurality of circular buffers dynamically changes operation of the plurality of interconnected processing elements. In embodiments, the plurality of circular buffers is programmed and instructions within the plurality of circular buffers provide for dynamic programming. Various embodiments of the flow 100 may be included in a computer program product embodied in a non-transitory computer readable medium that includes code executable by one or more processors.

Figure 2:
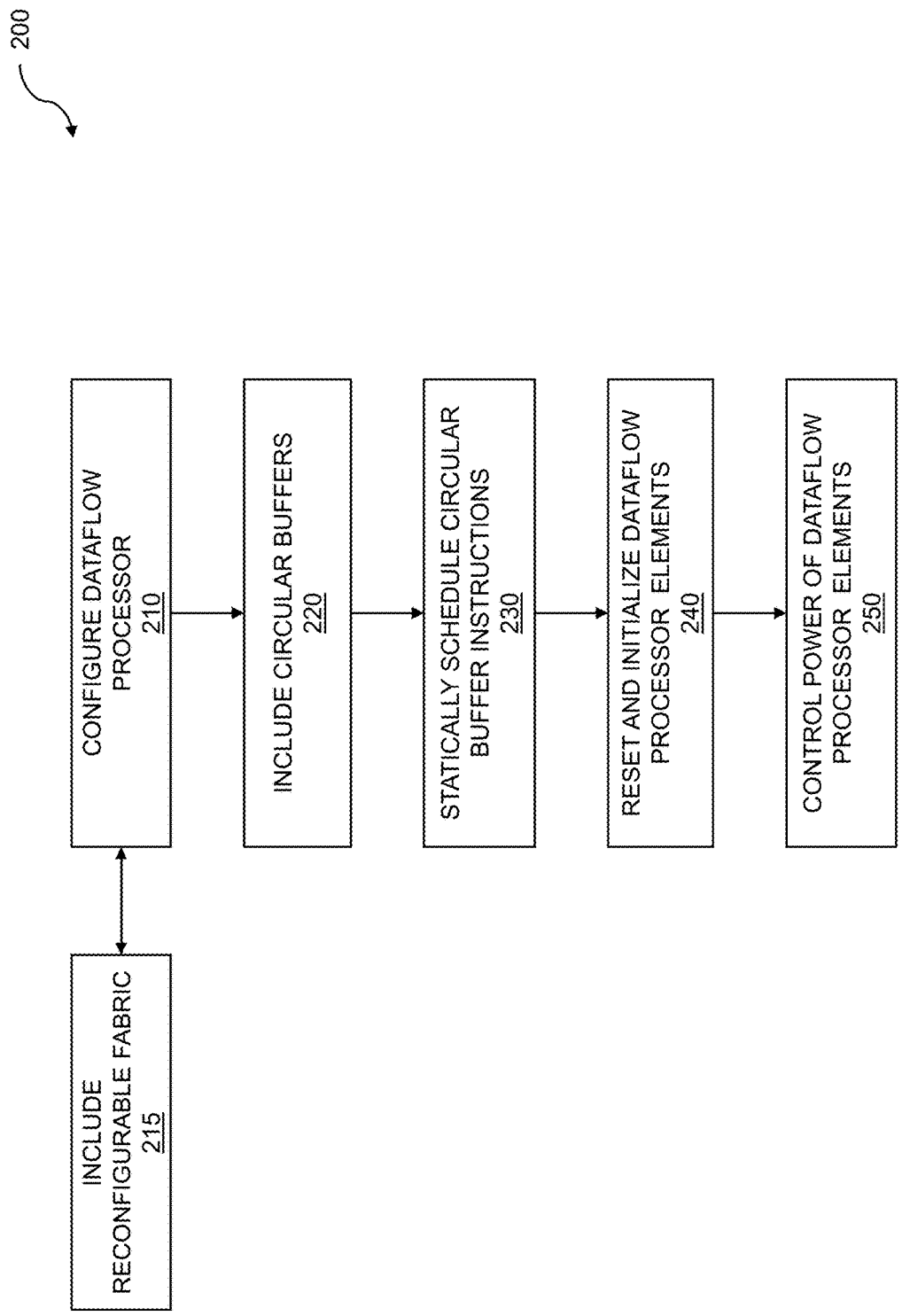
FIG. 2 is a flow diagram for a dataflow processor.

FIG. 2 is a flow diagram for a dataflow processor. The flow 200 includes configuring a dataflow processor 210. The dataflow processor can include reconfigurable processing elements that comprise a reconfigurable fabric 215. The dataflow processor can include circular buffers 220. The circular buffers contain instructions that control execution across the elements of the dataflow processor. The instructions can comprise agents that perform a specific function within the dataflow processor. The instructions contained in the circular buffers are statically scheduled 230. The scheduling, that is, the content, ordering, timing, and sequence of the instructions is computed ahead of execution time. The statically scheduled instructions are loaded into a plurality of circular buffers controlling the elements of the dataflow processor. The static scheduling can avoid conflicts and resource contention among processing elements, switching elements, and memory elements.

The flow 200 includes resetting and initializing the dataflow processor elements 240. The resetting and initializing can be accomplished by a variety of resetting and initialization techniques, including resetting a plurality of counters which control the addressing of the plurality of circular buffers. The counters can be reset to all zeros, to all ones, to an initialization code, etc. Resetting of the counters can result from a global reset signal being propagated across a cluster of processing elements, a cluster of clusters, etc. The flow 200 includes controlling power usage within the dataflow processor elements 250. The controlling can include setting one or more elements and/or circular buffers into a low power state. The controlling can include waking one or more elements and/or circular buffers from the sleep state as a result of valid data being presented to the one or more processing elements. Embodiments include configuring a plurality of interconnected processing elements such that they comprise a dataflow processor. Various embodiments of the flow 200 may be included in a computer program product embodied in a non-transitory computer readable medium that includes code executable by one or more processors.

Figure 3:
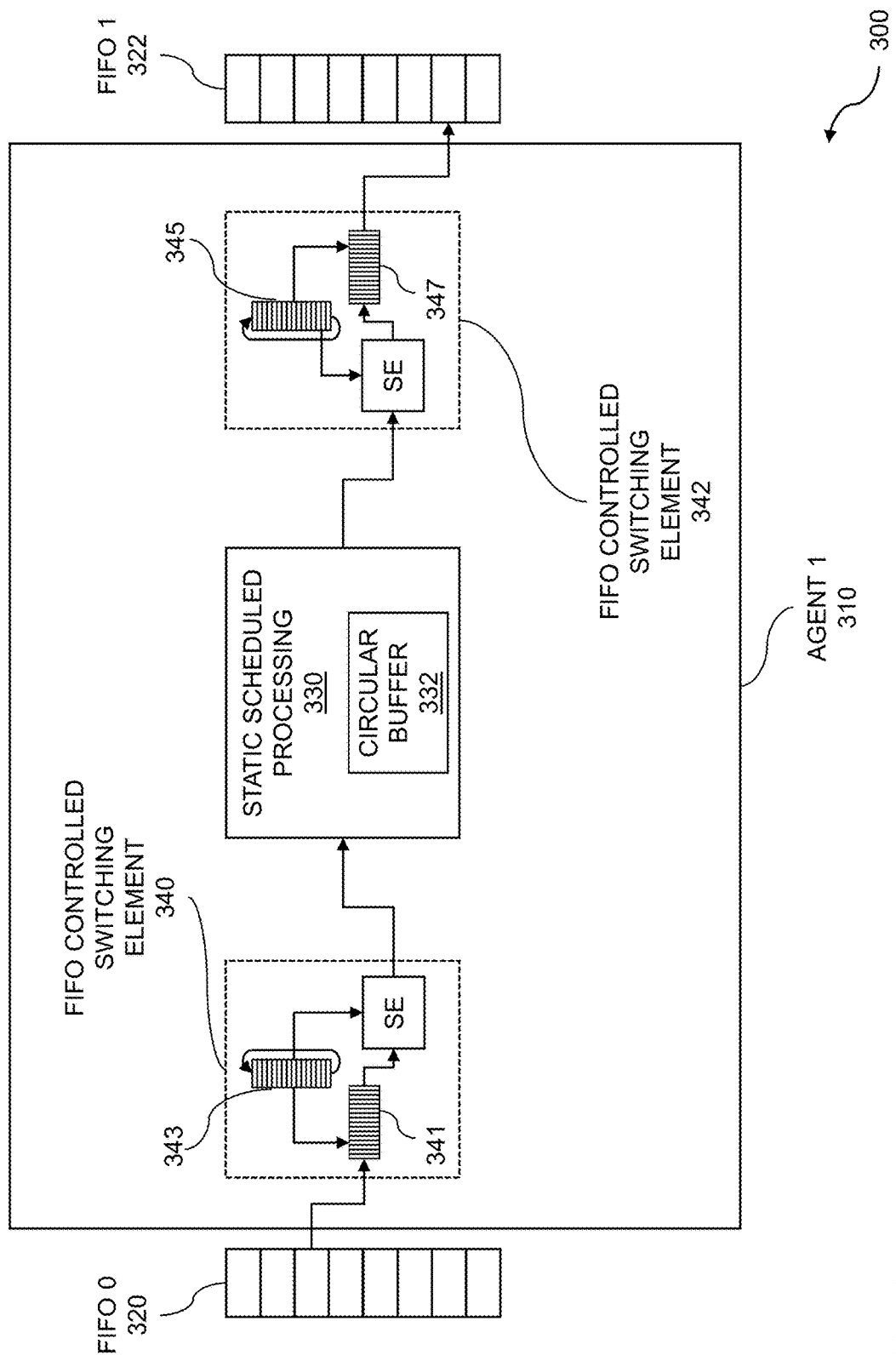
FIG. 3 shows scheduled sections relating to an agent.

FIG. 3 shows scheduled sections relating to an agent. In the example 300 shown, the scheduled selections relating to an agent can include remote usage of machine learned layers by a second machine learning construct. A first data group is collected in a first locality, and the first data group is applied to a first localized machine learning construct. A set t of convolutional layers is determined within the first localized machine learning construct based on the first data group where the first set of convolutional layers includes a first data flow graph machine. The first set of convolutional layers is sent to a second localized machine learning construct. The second localized machine learning construct can be similar to the first localized machine learning construct. A second data group is analyzed by the second machine learning construct using the first set of convolutional layers. A FIFO 320 serves as an input FIFO for a control agent 310. Data from FIFO 320 is read into local buffer 341 of FIFO controlled switching element 340. Circular buffer 343 may contain instructions that are executed by a switching element (SE), and may modify data based on one or more logical operations, including, but not limited to, XOR, OR, AND, NAND, and/or NOR. The plurality of processing elements can be controlled by circular buffers. The modified data may be passed to a circular buffer 332 under static scheduled processing 330. Thus, the scheduling of circular buffer 332 may be performed at compile time. The instructions loaded into circular buffer 332 may occur as part of a program initialization, and remain in the circular buffer 332 throughout the execution of the program (control agent). The circular buffer 332 may provide data to FIFO controlled switching element 342. Circular buffer 345 may rotate to provide a plurality of instructions/operations to modify and/or transfer data to data buffer 347, and is then transferred to external FIFO 322.

A process agent can include multiple components. An input component handles retrieval of data from an input FIFO. For example, agent 310 receives input from FIFO 320. An output component handles the sending of data to an output FIFO. For example, agent 310 provides data to FIFO 322. A signaling component can signal to process agents executing on neighboring processing elements about conditions of a FIFO. For example, a process agent can issue a FIRE signal to another process agent operating on another processing element when new data is available in a FIFO that was previously empty. Similarly, a process agent can issue a DONE signal to another process agent operating on another processing element when new space is available in a FIFO that was previously full. In this way, the process agent facilitates communication of data and FIFO states amongst neighboring processing elements to enable complex computations with multiple processing elements in an interconnected topology.

Figure 4:
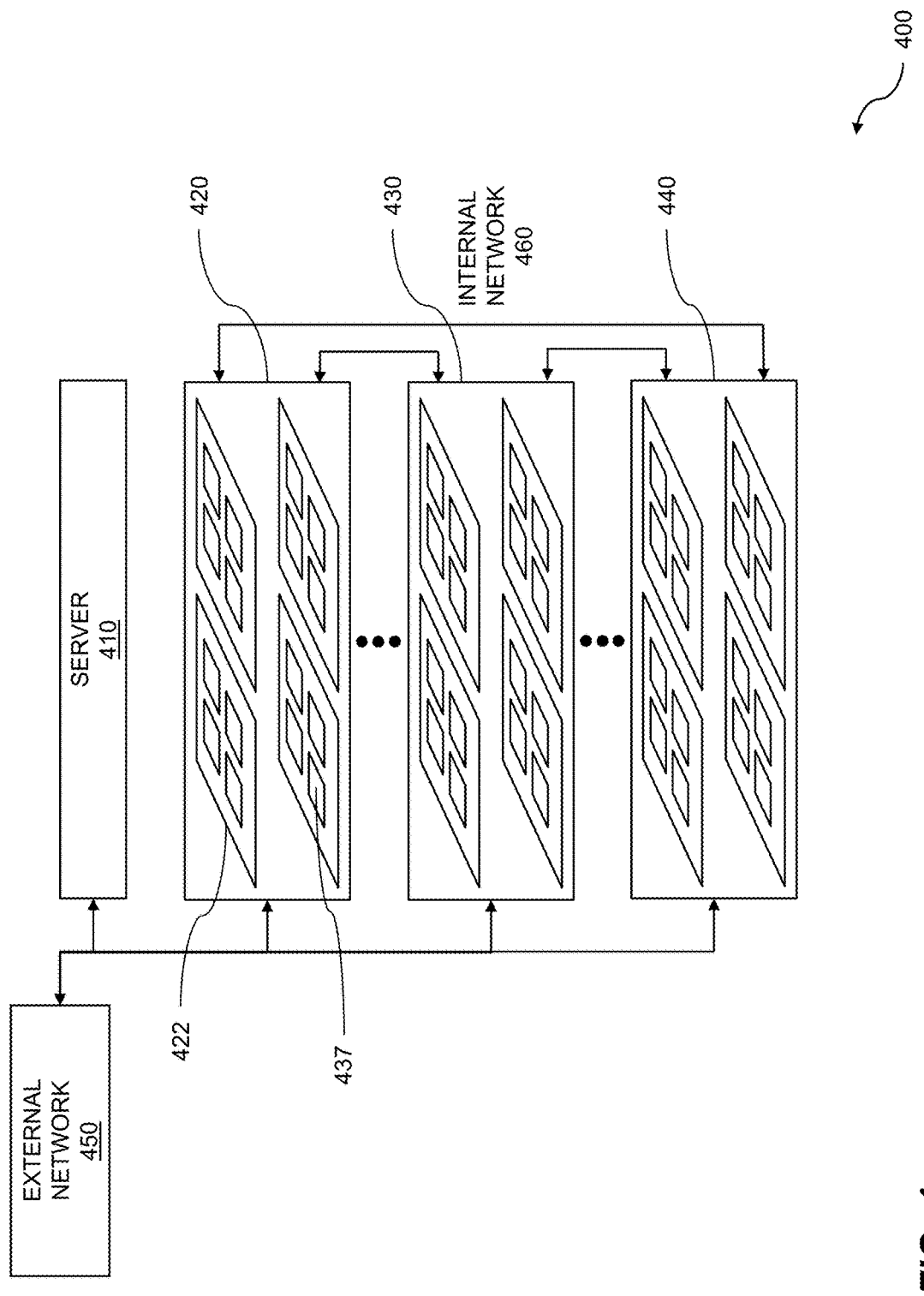
FIG. 4 illustrates a server allocating FIFOs and processing elements.

FIG. 4 illustrates a server allocating FIFOs and processing elements as part of implementing a dataflow graph. A system 400 can allocate one or more first-in first-outs (FIFOs) and processing elements (PEs) for remote usage of machine-learned layers by a second machine learning construct. A first data group is collected in a first locality. The first data group is applied to a first localized machine learning construct. The first learning construct can be a retail establishment, a vehicle, and so on. A first set of convolutional layers is determined within the first localized machine learning construct based on the first data group where the first set of convolutional layers includes a first data flow graph machine. The first set of convolutional layers is sent to a second localized machine learning construct. The second localized machine learning construct can be similar to the first localized machine learning construct. A second data group is analyzed by the second machine learning construct using the first set of convolutional layers.

A system 400 can include a server 410 allocating FIFOs and processing elements. In embodiments, system 400 includes one or more boxes, indicated by callouts 420, 430, and 440. Each box may have one or more boards, indicated generally as 422. Each board comprises one or more chips, indicated generally as 437. Each chip may include one or more processing elements, where at least some of the processing elements may execute a process agent. An internal network 460 allows communication between the boxes such that processing elements on one box can provide and/or receive results from processing elements on another box.

The server 410 may be a computer executing programs on one or more processors based on instructions contained in a non-transitory computer readable medium. The server 410 may perform reconfiguring of a mesh networked computer system comprising a plurality of processing elements with a FIFO between one or more pairs of processing elements. In some embodiments, each pair of processing elements has a dedicated FIFO configured to pass data between the processing elements of the pair. The server 410 may receive instructions and/or input data from external network 450. The external network may provide information that includes, but is not limited to, hardware description language instructions (e.g. Verilog, VHDL, or the like), flow graphs, source code, or information in another suitable format.

The server 410 may collect performance statistics on the operation of the collection of processing elements. The performance statistics can include number of fork operations, join operations, average sleep time of a processing element, and/or a histogram of the sleep time of each processing element. Any outlier processing elements that sleep more than a predetermined threshold can be identified. In embodiments, the server can resize FIFOs or create new FIFOs to reduce the sleep time of a processing element that exceeds the predetermined threshold. Sleep time is essentially time when a processing element is not producing meaningful results, so it is generally desirable to minimize the amount of time a processing element spends in a sleep mode. In some embodiments, the server 410 may serve as an allocation manager to process requests for adding or freeing FIFOs, and/or changing the size of existing FIFOs in order to optimize operation of the processing elements.

In some embodiments, the server may receive optimization settings from the external network 450. The optimization settings may include a setting to optimize for speed, optimize for memory usage, or balance between speed and memory usage. Additionally, optimization settings may include constraints on the topology, such as a maximum number of paths that may enter or exit a processing element, maximum data block size, and other settings. Thus, the server 410 can perform a reconfiguration based on user-specified parameters via external network 450.

Figure 5:
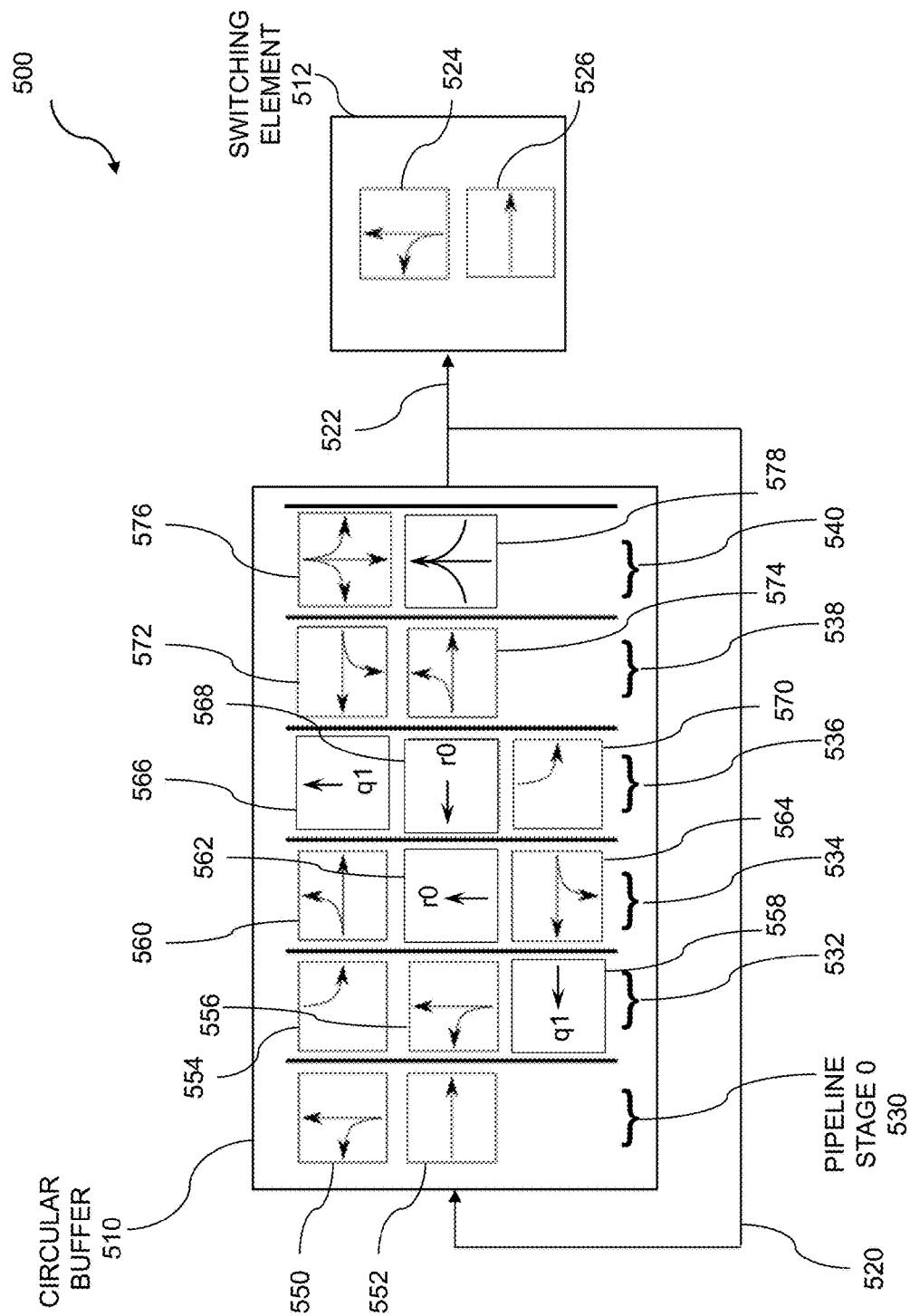
FIG. 5 is a block diagram of a circular buffer.

FIG. 5 is a block diagram 500 of a circular buffer 510 and a corresponding switching element 512. The block diagram 500 describes an apparatus for data manipulation. The circular buffer 510 contains a plurality of pipeline stages. Each pipeline stage contains one or more instructions, up to a maximum instruction depth. In the embodiment shown in FIG. 5, the circular buffer 510 is a 6×3 circular buffer, meaning that it implements a six-stage pipeline with an instruction depth of up to three instructions per stage (column). Hence, the circular buffer 510 can include one, two, or three switch instruction entries per column. In some embodiments, the plurality of switch instructions per cycle can comprise two or three switch instructions per cycle. However, in certain embodiments, the circular buffer 510 supports only a single switch instruction in a given cycle. In the example 500 shown, Pipeline Stage 0 530 has an instruction depth of two instructions 550 and 552. Though the remaining pipeline stages 1-5 are not textually labeled in the FIG. 500, the stages are indicated by callouts 532, 534, 536, 538, and 540. Pipeline stage 1 532 has an instruction depth of three instructions 554, 556, and 558. Pipeline stage 2 534 has an instruction depth of three instructions 560, 562, and 564. Pipeline stage 3 536 also has an instruction depth of three instructions 566, 568, and 570. Pipeline stage 4 538 has an instruction depth of two instructions 572 and 574. Pipeline stage 5 540 has an instruction depth of two instructions 576 and 578. In embodiments, the circular buffer 510 includes 64 columns.

During operation, the circular buffer 510 rotates through configuration instructions. The circular buffer 510 can dynamically change operation of the logical elements based on the rotation of the circular buffer. The circular buffer 510 can comprise a plurality of switch instructions per cycle for the configurable connections.

The instruction 552 is an example of a switch instruction. In embodiments, each cluster has four inputs and four outputs, each designated within the cluster's nomenclature as "north," "east," "south," and "west" respectively. For example, the instruction 552 in the block diagram 500 is a west-to-east transfer instruction. The instruction 552 directs the cluster to take data on its west input and send out the data on its east output. In another example of data routing, the instruction 550 is a fan-out instruction. The instruction 550 instructs the cluster to take data on its south input and send out on the data on both its north output and its west output. The arrows within each instruction box indicate the source and destination of the data. The instruction 578 is an example of a fan-in instruction. The instruction 578 takes data from the west, south, and east inputs and sends out the data on the north output. Therefore, the configurable connections can be considered to be time multiplexed.

In embodiments, the clusters implement multiple storage elements in the form of registers. In the example 500 shown, the instruction 562 is a local storage instruction. The instruction 562 takes data from the instruction's south input and stores it in a register (r0). The instruction 568 is a retrieval instruction. The instruction 568 takes data from the register (r0) and outputs it on the instruction's west output. Some embodiments utilize four general purpose registers, referred to as registers r0, r1, r2, and r3. The registers are, in embodiments, storage elements which store data while the configurable connections are busy with other data. In embodiments, the storage elements are 32-bit registers. In other embodiments, the storage elements are 64-bit registers. Other register widths are possible.

In embodiments, the clusters implement multiple processing elements in the form of processor cores, referred to as cores q0, q1, q2, and q3. In embodiments, four cores are used, though any number of cores can be implemented. The instruction 558 is a processing instruction. The instruction 558 takes data from the instruction's east input and sends it to a processor q1 for processing. In embodiments, the processor q1 is assumed to be awake and not in a sleep state. In other embodiments, the processor q1 is woken from a sleep state at the arrival of the valid data arriving from the east input. In some cases, the processor q1 can be placed into a sleep state after the arriving data has been processed as needed. There can be a latency in a waking process or in a situation where the processor is going to sleep. The latency allows for no adverse side effects on the data being processed or the processing which will shortly occur. The processors can perform logic operations on the data, including, but not limited to, a shift operation, a logical AND operation, a logical OR operation, a logical NOR operation, a logical XOR operation, an addition, a subtraction, a multiplication, and a division. Thus, the configurable connections can comprise one or more of a fan-in, a fan-out, or a local storage.

In the example 500 shown, the circular buffer 510 rotates instructions in each pipeline stage into switching element 512 via a forward data path 522, and also back to a pipeline stage 0 530 via a feedback data path 520. Instructions can include switching instructions, storage instructions, and processing instructions, among others. The feedback data path 520 can allow instructions within the switching element 512 to be transferred back to the circular buffer. Hence, the instructions 524 and 526 in the switching element 512 can also be transferred back to pipeline stage 0 as the instructions 550 and 552. In addition to the instructions depicted on FIG. 5, a no-op instruction or a sleep instruction can also be inserted into a pipeline stage. In embodiments, a no-op instruction causes execution to not be performed for a given cycle. In effect, the introduction of a no-op instruction can cause a column within the circular buffer 510 to be skipped in a cycle. In contrast, not skipping an operation indicates that a valid instruction is being pointed to in the circular buffer. A sleep state can be accomplished by not applying a clock to a circuit, performing no processing within a processor, removing a power supply voltage or bringing a power supply to ground, storing information into a non-volatile memory for future use and then removing power applied to the memory, or by similar techniques. A sleep instruction that causes no execution to be performed until a predetermined event occurs which causes the logical element to exit the sleep state can also be explicitly specified. The predetermined event can be the arrival or availability of valid data. The data can be determined to be valid using null convention logic (NCL). In embodiments, only valid data can flow through the switching elements and Xs (invalid data points) are not propagated by instructions.

In some embodiments, the sleep state is exited based on an instruction applied to a switching fabric. The sleep state can, in some embodiments, only be exited by stimulus external to the logical element and not based on the programming of the logical element. The external stimulus can include an input signal, which in turn can cause a wake up or an interrupt service request to execute on one or more of the logical elements. An example of such a wake-up request can be seen in the instruction 558, assuming that the processor q1 was previously in a sleep state. In embodiments, when the instruction 558 takes valid data from the east input and applies that data to the processor q1, the processor q1 wakes up and operates on the received data. In the event that the data is not valid, the processor q1 can remain in a sleep state. At a later time, data can be retrieved from the q1 processor, e.g. by using an instruction such as the instruction 566. In the case of the instruction 566, data from the processor q1 is moved to the north output. In some embodiments, if Xs have been placed into the processor q1, such as during the instruction 558, then Xs would be retrieved from the processor q1 during the execution of the instruction 566 and applied to the north output of the instruction 566. In embodiments, the processing element wakes up from the sleep state when valid data is applied to inputs of the processing element.

A collision occurs if multiple instructions route data to a particular port in a given pipeline stage simultaneously. For example, if instructions 552 and 554 are in the same pipeline stage, they will both send data to the east output at the same time, thus causing a collision since neither instruction is part of a time-multiplexed fan-in instruction (such as the instruction 578). To avoid potential collisions, certain embodiments use preprocessing, such as by a compiler, to arrange the instructions in such a way that there are no collisions when the instructions are loaded into the circular buffer. In embodiments, the preprocessing can insert further instructions to prevent collisions. Thus, the circular buffer 510 can be statically scheduled in order to prevent data collisions. In embodiments, when the preprocessor detects a data collision, the scheduler changes the order of the instructions to prevent the collision. Alternatively or additionally, the preprocessor can insert further instructions such as storage instructions (e.g. the instruction 562), sleep instructions, or no-op instructions, to prevent the collision. Alternatively or additionally, the preprocessor can replace multiple instructions with a single fan-in instruction. For example, if a first instruction sends data from the south input to the north output and a second instruction sends data from the west input to the north output in the same pipeline stage, the first and second instruction can be replaced with a fan-in instruction that routes the data from both of those inputs to the north output in a deterministic way to avoid a data collision. In this case, the machine can guarantee that valid data is only applied on one of the inputs for the fan-in instruction.

Figure 6:
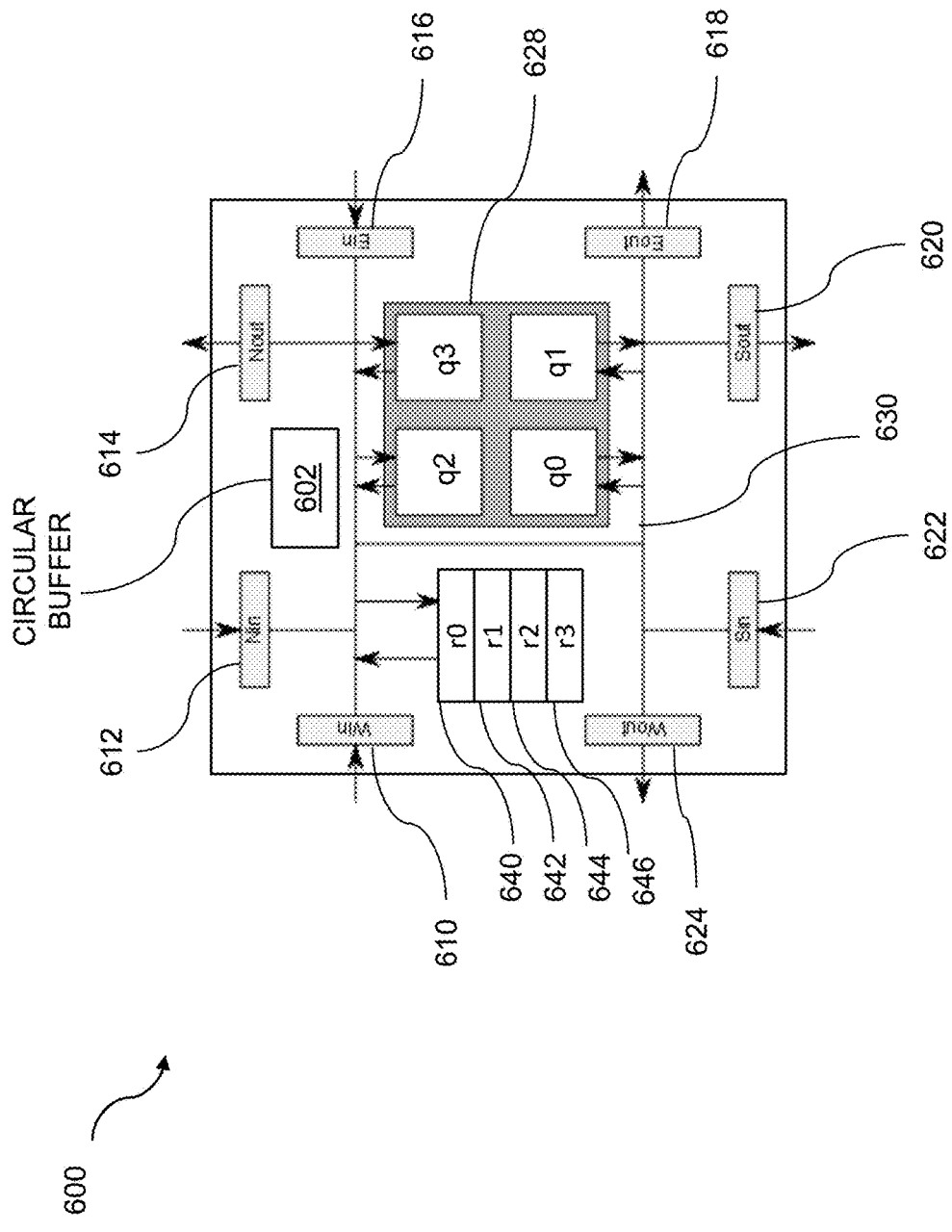
FIG. 6 is an example cluster for course-grained reconfigurable processing.

FIG. 6 is an example cluster 600 for course-grained reconfigurable processing. The cluster 600 comprises a circular buffer 602, which operates similarly to the circular buffer 510 of FIG. 5. The circular buffer 602 can be referred to as a main circular buffer or a switch-instruction circular buffer. In some embodiments, the cluster 600 comprises additional circular buffers corresponding to processing elements within the cluster. The additional circular buffers can be referred to as processor instruction circular buffers. The example cluster 600 comprises a plurality of logical elements, configurable connections between the logical elements, and a circular buffer 602 controlling the configurable connections. The logical elements can further comprise one or more of switching elements, processing elements, or storage elements. The example cluster 600 also comprises four processing elements (q0, q1, q2, and q3). The four processing elements can collectively be referred to as a "quad," and jointly indicated by a grey reference box 628. In embodiments, there is intercommunication among and between each of the four processing elements. In embodiments, the circular buffer 602 controls the passing of data to the quad of processing elements 628 through switching elements. In embodiments, the four processing elements 628 comprise a processing cluster. In some cases, the processing elements can be placed into a sleep state. In embodiments, the processing elements wake up from a sleep state when valid data is applied to the inputs of the processing elements. In embodiments, the individual processors of a processing cluster share data and/or instruction caches. The individual processors of a processing cluster can implement message passing via a bus or shared memory interface. Power gating can be applied to one or more processors (e.g. q1) in order to reduce power. In embodiments, the circular buffer within the plurality of rotating circular buffers controls passing data to a quad of processing elements through switching elements, where each of the quad of processing elements is controlled by four other circular buffers, where data is passed back through the switching elements from the quad of processing elements where the switching elements are again controlled by the circular buffer within the plurality of rotating circular buffers.

The cluster 600 can further comprise storage elements coupled to the configurable connections. As shown, the cluster 600 comprises four storage elements (r0 640, r1 642, r2 644, and r3 646). The cluster 600 further comprises a north input (Nin) 612, a north output (Nout) 614, an east input (Ein) 616, an east output (Eout) 618, a south input (Sin) 622, a south output (Sout) 620, a west input (Win) 610, and a west output (Wout) 624. The circular buffer 602 can contain switch instructions that implement configurable connections. For example, an instruction such as the instruction 560 in FIG. 5 effectively connects the west input 610 with the north output 614 and the east output 618 and this routing is accomplished via bus 630. The cluster 600 can further comprise a plurality of circular buffers residing on a semiconductor chip, where the plurality of circular buffers controls unique, configurable connections between the logical elements.

As stated previously, the preprocessor can be configured to prevent data collisions within the circular buffer 602. The prevention of collisions can be accomplished by inserting no-op or sleep instructions into the circular buffer (pipeline). Alternatively, in order to prevent a collision on an output port, intermediate data can be stored in registers for one or more pipeline cycles before being sent out on the output port. In embodiments, collisions are avoided by intermediate data being stored in registers for pipeline cycles before being sent to an output port for a cluster.

In other situations, the preprocessor can change one switching instruction to another switching instruction to avoid a conflict. For example, in some instances the preprocessor can change an instruction placing data on the west output 624 to an instruction placing data on the south output 620, such that the data can be output on both output ports within the same pipeline cycle. In a case where data needs to travel to a cluster that is both south and west of the cluster 600, it can be more efficient to send the data directly to the south output port rather than storing the data in a register and sending the data to the west output on a subsequent pipeline cycle.

Figure 7:
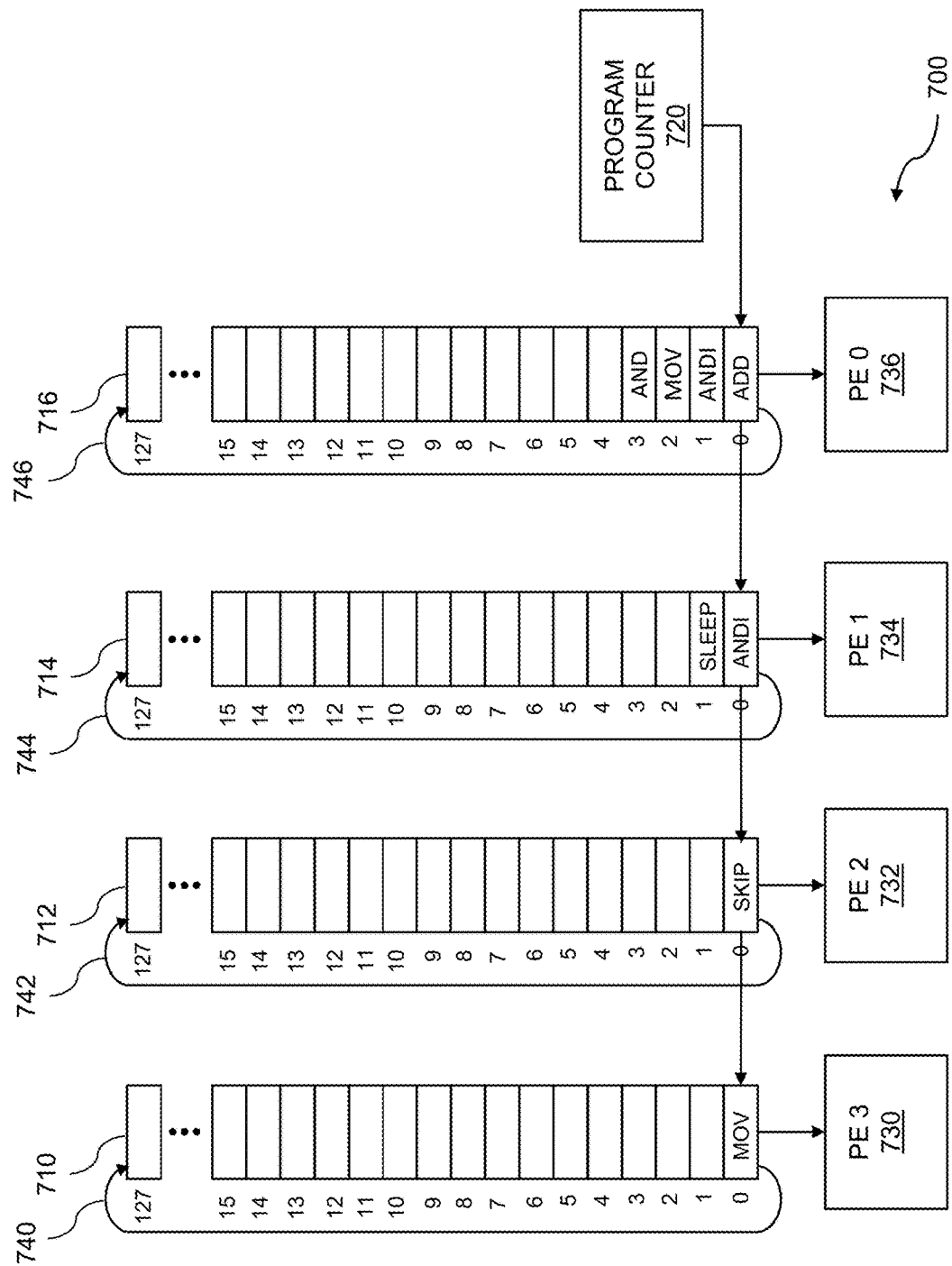
FIG. 7 shows an example instruction execution for processing elements.

FIG. 7 shows a diagram 700 indicating an example instruction execution for processing elements. In this embodiment, in addition to the main circular buffer for a cluster (for example, the buffer 602 of FIG. 6), an additional circular buffer is implemented for each processing element. A circular buffer 710 feeds a processing element 730. A circular buffer 712 feeds another processing element 732. A third circular buffer 714 feeds another processing element 734. A fourth circular buffer 716 feeds another processing element 736. The four processing elements 730, 732, 734, and 736 can represent a quad of processing elements. In embodiments, the processing elements 730, 732, 734, and 736 are controlled by instructions received from the circular buffers 710, 712, 714, and 716. The circular buffers can be implemented using feedback paths 740, 742, 744, and 746, respectively. In embodiments, the circular buffer (e.g. 202 of FIG. 2) can control the passing of data to a quad of processing elements through switching elements, where each of the quad of processing elements is controlled by four other circular buffers (e.g. 710, 712, 714, and 716) and where data is passed back through the switching elements from the quad of processing elements where the switching elements are again controlled by the main circular buffer. In embodiments, a program counter 720 is configured to point to the current instruction within a circular buffer. In these embodiments, the contents of the circular buffer are not shifted or copied to new locations on each instruction cycle. Rather, the program counter 720 is incremented in each cycle to point to a new location in the circular buffers. The circular buffers 710, 712, 714, and 716 can contain instructions for the processing elements. The instructions can include, but are not limited to, move instructions, skip instructions, logical AND instructions, logical AND-Invert (e.g. ANDI) instructions, logical OR instructions, shift instructions, sleep instructions, and so on. A sleep instruction can be usefully employed in numerous situations. The sleep state can be entered by an instruction within one of the processing elements. One or more of the processing elements can be in a sleep state at any given time. In some situations a sleep state is entered after a certain amount of latency. They latency delay to a sleep state can be a function of the time or cycles required to enter a sleep state, a function of the operations currently ongoing and needing completion before a sleep state is entered, and the like. When a sleep state is entered, the processing elements are handled so that data and state information are not lost and there are no adverse impacts as a result of moving into a sleep state. When awaking from a sleep state, in some cases, a delay can be required during the wake-up process. The wake-up process can involve a series of Noop (no operation) cycles while a stable state is reached. Once the wake-up process is complete, the next calculations or operations can be performed. In some embodiments, a "skip" can be performed on an instruction and the instruction in the circular buffer can be ignored and the corresponding operation not performed. In embodiments, the circular buffers 710, 712, 714, and 716 have a length of 128 instructions, as indicated by the indices for each of the circular buffers 710, 712, 714, and 716, but other circular buffer lengths are also possible.

The instructions can cause the processing elements to implement different functions as the circular buffer rotates. For example, PE 0 736 can execute a logical AND instruction, which is shown at index 0 of circular buffer 716. The rotation of the circular buffer can then facilitate the execution of an AND-Invert instruction, which is shown at index 1 of circular buffer 716. The further rotation of the circular buffer can then facilitate the execution of a MOV instruction, which is shown at index 2 of circular buffer 716. The further rotation of the circular buffer can then facilitate the execution of another AND instruction, which is shown at index 3 of circular buffer 716. Additional instructions can likewise be executed. In embodiments, the diagram 700 can comprise a reconfigurable fabric. When diagram 700 comprises a reconfigurable fabric, it is evident how PE 0 736, PE 1 734, PE 2 732, and PE 3 730 can provide a completely new function every time the circular buffer rotates. For example, the instructions at index 0 of circular buffers 716, 714, 712, and 710, can cause their respective processing elements, PE 0 736, PE 1 734, PE 2 732, and PE 3 730, to perform a function of moving data from one processing cluster to another. However, the very next rotation of the circular buffers can cause the processing elements to perform a completely different macro-level function, such as manipulating the data before it is, in a subsequent further rotation of the circular buffers, moved again to another processing cluster. Thus it can be seen how a rotating circular buffer enables two or more logical functions to be implemented in run time. This example is intended to be illustrative, not limiting, of the multi-function execution enabled by the circular buffers.

Figure 8:
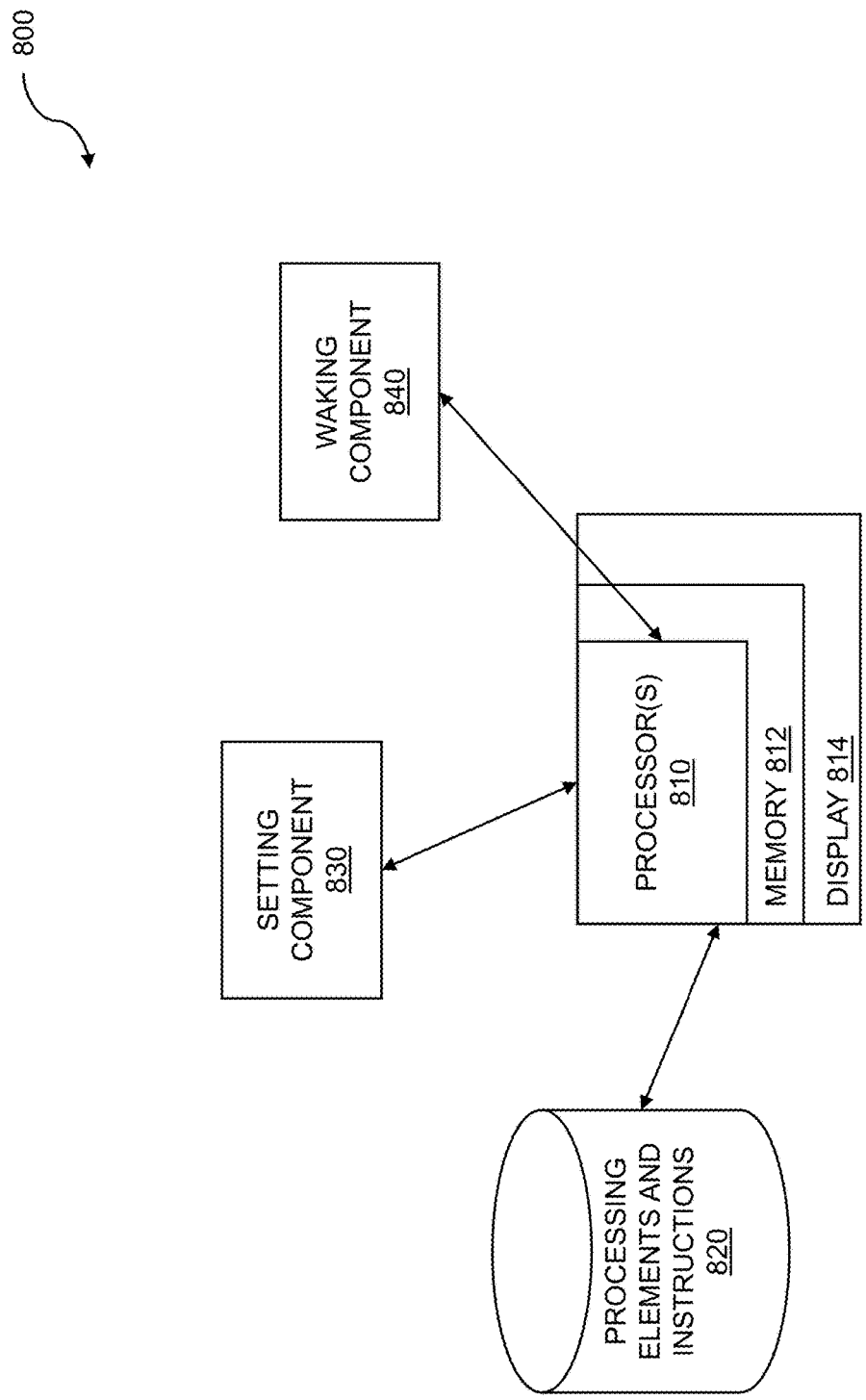
FIG. 8 is a system for power conservation.

FIG. 8 is a system for power conservation. A plurality of interconnected processing elements and a plurality of instructions can be configured. A first processing element, from the plurality of interconnected processing elements, can be set into a sleep state by a first instruction from the plurality of instructions. The first processing element can be woken from the sleep state as a result of valid data being presented to the first processing element. The system 800 can include one or more processors 810 coupled to a memory 812 which stores instructions. The system 800 can include a display 814 coupled to the one or more processors 810 for displaying data, intermediate steps, instructions, processing element information, and so on. The one or more processors 810 attached to the memory 812 where the one or more processors, when executing the instructions which are stored, are configured to: configure a plurality of interconnected processing elements and a plurality of instructions, wherein the plurality of instructions is contained within a plurality of circular buffers; set a first processing element, from the plurality of interconnected processing elements, into a sleep state by a first instruction from the plurality of instructions; and wake the first processing element from the sleep state as a result of valid data being presented to the first processing element. Information relating to processing elements and instructions for programming the processing elements can be stored in processing elements and instructions store 820. A setting component 830 can set a first processing element, from the plurality of interconnected processing elements, into a sleep state by a first instruction from the plurality of instructions. A waking component 840 can wake the first processing element from the sleep state as a result of valid data being presented to the first processing element. Subsections of the plurality of interconnected processing elements can also be set into a sleep state based on the first processing element being set into a sleep state. The subsection of the plurality of interconnected processing elements can be woken.

In embodiments, a computer program product embodied in a non-transitory computer readable medium for power conservation, the computer program product comprising code which causes one or more processors to perform operations of: configuring a plurality of interconnected processing elements and a plurality of instructions, wherein the plurality of instructions is contained within a plurality of circular buffers; setting a first processing element, from the plurality of interconnected processing elements, into a sleep state by a first instruction from the plurality of instructions; and waking the first processing element from the sleep state as a result of valid data being presented to the first processing element.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above-mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a technique for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A processor-implemented method for power conservation comprising:
    configuring a plurality of interconnected processing elements and a plurality of instructions, wherein the plurality of instructions is contained within a plurality of circular buffers;
    setting a first processing element, from the plurality of interconnected processing elements, into a sleep state by a first instruction from the plurality of instructions, wherein at least one circular buffer from the plurality of circular buffers remains awake while the first processing element is in the sleep state, and wherein the at least one circular buffer provides for data steering through a reconfigurable fabric; and
    waking the first processing element from the sleep state as a result of valid data being presented to the first processing element.

2. The method of claim 1 wherein the configuring a plurality of interconnected processing elements comprises a dataflow processor.

3. The method of claim 1 wherein the plurality of circular buffers is statically scheduled.

4. The method of claim 1 wherein the plurality of circular buffers dynamically changes operation of the plurality of interconnected processing elements.

5. The method of claim 1 wherein a circular buffer from the plurality of circular buffers is formed from a memory and an address pointer sequencing through an address space in a circular fashion.

6. The method of claim 1 wherein a circular buffer, from the plurality of circular buffers, and associated with the first processing element is placed into the sleep state along with the first processing element.

7. The method of claim 6 wherein the circular buffer wakes along with the first processing element.

8. The method of claim 7 wherein the circular buffer wakes at a same address as when the circular buffer was placed in the sleep state.

9. The method of claim 7 wherein the circular buffer wakes at an address that has continued to increment while the circular buffer was in the sleep state.

10. The method of claim 1 wherein a circular buffer associated with the first processing element continues to cycle while the first processing element is in the sleep state but instructions from the circular buffer are not executed.

11. The method of claim 1 wherein the sleep state comprises a rapid transition to sleep state capability.

12. The method of claim 11 wherein the waking is accomplished with a rapid transition to being awake.

13. The method of claim 11 wherein the rapid transition to sleep state capability is accomplished by limiting clocking to portions of the plurality of interconnected processing elements.

14. The method of claim 1 wherein the sleep state comprises a slow transition to sleep state capability.

15. The method of claim 14 wherein the slow transition to sleep state capability is accomplished by powering down portions of the plurality of interconnected processing elements.

16. The method of claim 1 wherein the valid data is provided by a second processing element from the plurality of interconnected processing elements.

17. The method of claim 1 further comprising setting a subsection of the plurality of interconnected processing elements to also be set into a sleep state based on the first processing element being set into a sleep state.

18. The method of claim 17 further comprising waking the subsection of the plurality of interconnected processing elements.

19. The method of claim 1 wherein a third processing element remains asleep due to non-valid data being provided to the third processing element.

20. The method of claim 1 wherein the waking the first processing element from the sleep state is further based on non-empty data being presented to the first processing element.

21. The method of claim 1 wherein the first processing element places itself into the sleep state.

22. The method of claim 1 wherein all processing elements from the plurality of interconnected processing elements are placed into a sleep state based on the first processing element being set into a sleep state.

23. The method of claim 1 wherein a quad of processors associated with the first processing element are placed into a sleep state based on the first processing element being set into a sleep state.

24. A computer program product embodied in a non-transitory computer readable medium for power conservation, the computer program product comprising code which causes one or more processors to perform operations of:
configuring a plurality of interconnected processing elements and a plurality of instructions, wherein the plurality of instructions is contained within a plurality of circular buffers;
setting a first processing element, from the plurality of interconnected processing elements, into a sleep state by a first instruction from the plurality of instructions, wherein at least one circular buffer from the plurality of circular buffers remains awake while the first processing element is in the sleep state, and wherein the at least one circular buffer provides for data steering through a reconfigurable fabric; and
waking the first processing element from the sleep state as a result of valid data being presented to the first processing element.

25. A computer system for power conservation comprising:
a memory which stores instructions;
one or more processors attached to the memory wherein the one or more processors, when executing the instructions which are stored, are configured to:
configure a plurality of interconnected processing elements and a plurality of instructions, wherein the plurality of instructions is contained within a plurality of circular buffers;
set a first processing element, from the plurality of interconnected processing elements, into a sleep state by a first instruction from the plurality of instructions, wherein at least one circular buffer from the plurality of circular buffers remains awake while the first processing element is in the sleep state, and wherein the at least one circular buffer provides for data steering through a reconfigurable fabric; and
wake the first processing element from the sleep state as a result of valid data being presented to the first processing element.

* * * * *